(12) United States Patent
Lukanc (10) Patent No.: US 7,246,277 B2
(45) Date of Patent: Jul. 17, 2007

(54) TEST BUS ARCHITECTURE FOR EMBEDDED RAM AND METHOD OF OPERATING SAME

(76) Inventor: Jeffrey Lukanc, 1450 Calaveras Ave., San Jose, CA (US) 95126

( * ) Notice: Subject to any disclaimer, the term of this patent is extended or adjusted under 35 U.S.C. 154(b) by 801 days.

(21) Appl. No.: 09/887,913

(22) Filed: Jun. 20, 2001

(65) Prior Publication Data

US 2003/0009712 A1    Jan. 9, 2003

(51) Int. Cl.
*G11C 29/00* (2006.01)
(52) U.S. Cl. .................. 714/718; 714/30; 702/118
(58) Field of Classification Search ............. 365/750; 380/4, 25; 714/718, 722, 27, 30, 31; 702/117–118
See application file for complete search history.

(56) References Cited

U.S. PATENT DOCUMENTS

| | | | |
|---|---|---|---|
| 5,132,973 A * | 7/1992 | Obermeyer ................ 714/718 |
| 5,423,050 A * | 6/1995 | Taylor et al. ................ 714/31 |
| 5,499,249 A | 3/1996 | Agrawal et al. | |
| 5,515,540 A * | 5/1996 | Grider et al. ............... 395/750 |
| 5,568,437 A * | 10/1996 | Jamal ........................ 365/201 |
| 5,781,749 A | 7/1998 | Le Quere | |
| 5,812,469 A * | 9/1998 | Nadeau-Dostie et al. ... 365/201 |
| 5,812,562 A | 9/1998 | Baeg | |
| 5,828,825 A | 10/1998 | Eskandari et al. | |
| 5,828,856 A | 10/1998 | Bowes et al. | |
| 5,892,777 A | 4/1999 | Nesheiwat et al. | |
| 5,896,396 A | 4/1999 | Sanghani et al. | |
| 6,101,457 A * | 8/2000 | Barch et al. ................ 702/117 |
| 6,128,758 A * | 10/2000 | Hall et al. .................. 714/727 |
| 6,212,114 B1 * | 4/2001 | Cowles ....................... 365/201 |
| 6,408,413 B1 * | 6/2002 | Whetsel ...................... 714/727 |
| 6,587,979 B1 * | 7/2003 | Kraus et al. ................ 714/720 |
| 6,665,817 B1 * | 12/2003 | Rieken ......................... 714/30 |

\* cited by examiner

*Primary Examiner*—Guy J. Lamarre
(74) *Attorney, Agent, or Firm*—Bever, Hoffman & Harm, LLP.

(57) ABSTRACT

A test bus architecture for an integrated circuit chip including a plurality of embedded RAM/register blocks, a corresponding plurality of test modules, and a dedicated test bus. Each RAM/register block is coupled to a corresponding test module, as well as to system circuitry. Each test module is coupled to the test bus. The embedded RAM/register blocks are accessible through the system circuitry during normal operation. During a test mode the embedded RAM/register blocks are accessible through the test modules and test bus. During the test mode, test data values are written to the RAM/register blocks by broadcasting test data values to all of the RAM/register blocks on the test bus. Subsequently, the test data values are read from the RAM/register blocks by individually accessing the RAM/register blocks on the test bus. The test modules are assigned unique addresses, thereby enabling the RAM/register blocks to be addressed during the read operations.

21 Claims, 5 Drawing Sheets

TEST BUS ARCHITECTURE FOR EMBEDDED RAM AND METHOD OF OPERATING SAME

FIELD OF THE INVENTION

The present invention relates to a test bus that provides test capability to integrated random access memories (RAMs) and register files.

DISCUSSION OF RELATED ART

Conventional integrated circuit chips typically include random access memory (RAM) that should be tested to ensure that the RAM is functional (i.e., free of defects). Relatively large RAMs (i.e., 2 Mb or larger) typically have a dedicated built-in self test (BIST) unit, which writes a predetermined bit pattern to the RAM. The contents of the RAM are then read and compared with the predetermined bit pattern to determine whether the RAM includes any defective memory cells. Because of the overhead associated with the BIST circuitry, this technique is only used for relatively large RAMs. Moreover, because BIST circuitry only provides a predetermined bit pattern for testing the RAM, the testing of the RAM may be inadequate because of a limited bit pattern. Furthermore, stress tests, in which the operating speed of the RAM is tested, cannot be readily performed using BIST circuitry.

Smaller RAMs, such as register files, are typically difficult to test. Providing a separate BIST circuit to test each of these small RAMs is impractical, as the overhead associated with the BIST circuitry would result in an undesirably large circuit layout area. In addition, because the smaller RAMs are typically embedded in a logic system (i.e., an ethernet system or an ATM system), it can be difficult to provide the desired write addresses to the smaller RAMS, route the desired test data values to these RAMs, and subsequently read the test data values out of the RAMs. As a result, these smaller RAMs are typically not tested, or are tested with significant difficulty.

It would therefore be desirable to have a test system that overcomes the deficiencies of the prior art.

SUMMARY

Accordingly, the present invention provides an integrated circuit chip having a plurality of embedded random access memory (RAM)/register blocks, a corresponding plurality of test modules, and a dedicated test bus. In one embodiment, the embedded RAM/register blocks are relatively small (i.e., have a capacity of less than 32 Kb), and of the type that do not typically include associated BIST circuitry. Each of the RAM/register blocks is coupled to a corresponding test module, as well as to system circuitry. Each of the test modules is coupled to the test bus. The embedded RAM/ register blocks are accessible through the system circuitry during normal operation. During a test mode the embedded RAM/register blocks are accessible through the test modules and the test bus.

In one embodiment, the test bus includes a set of lines for transmitting data and address information to the test modules, a line for transmitting a test bus clock signal to the test modules, and a set of lines for carrying instructions to the test modules, wherein the instructions identify the test mode. The test bus can also include a set of lines for transmitting byte-enable information and a set of lines for transmitting data received from the RAM/register blocks.

During the test mode, test data values are written to the RAM/register blocks by broadcasting test data values to all of the test modules on the test bus. The test modules transfer the test data values to the RAM/register blocks. Subsequently, the test data values are read from the RAM/register blocks by individually accessing the RAM/register blocks via the test bus and the test modules. The test modules are assigned unique addresses, thereby enabling the RAM/ register blocks to be addressed during the read operations.

In accordance with another embodiment of the present invention, a switching structure is provided to enable the same set of pads to be used for the test bus during the test mode, and for other system signals during normal operation. This switching structure can be controlled by a tap state of a JTAG controller located on the chip.

During the test mode, the signals on the test bus are operated in response to a test clock signal, and the RAM/ register blocks are operated in response to an independent system clock signal. By independently adjusting the various edges of the test clock signal and the system clock signal, stress testing can be performed on the RAM/register blocks.

The present invention will be more fully understood in view of the following description and drawings.

DETAILED DESCRIPTION

Figure 1:
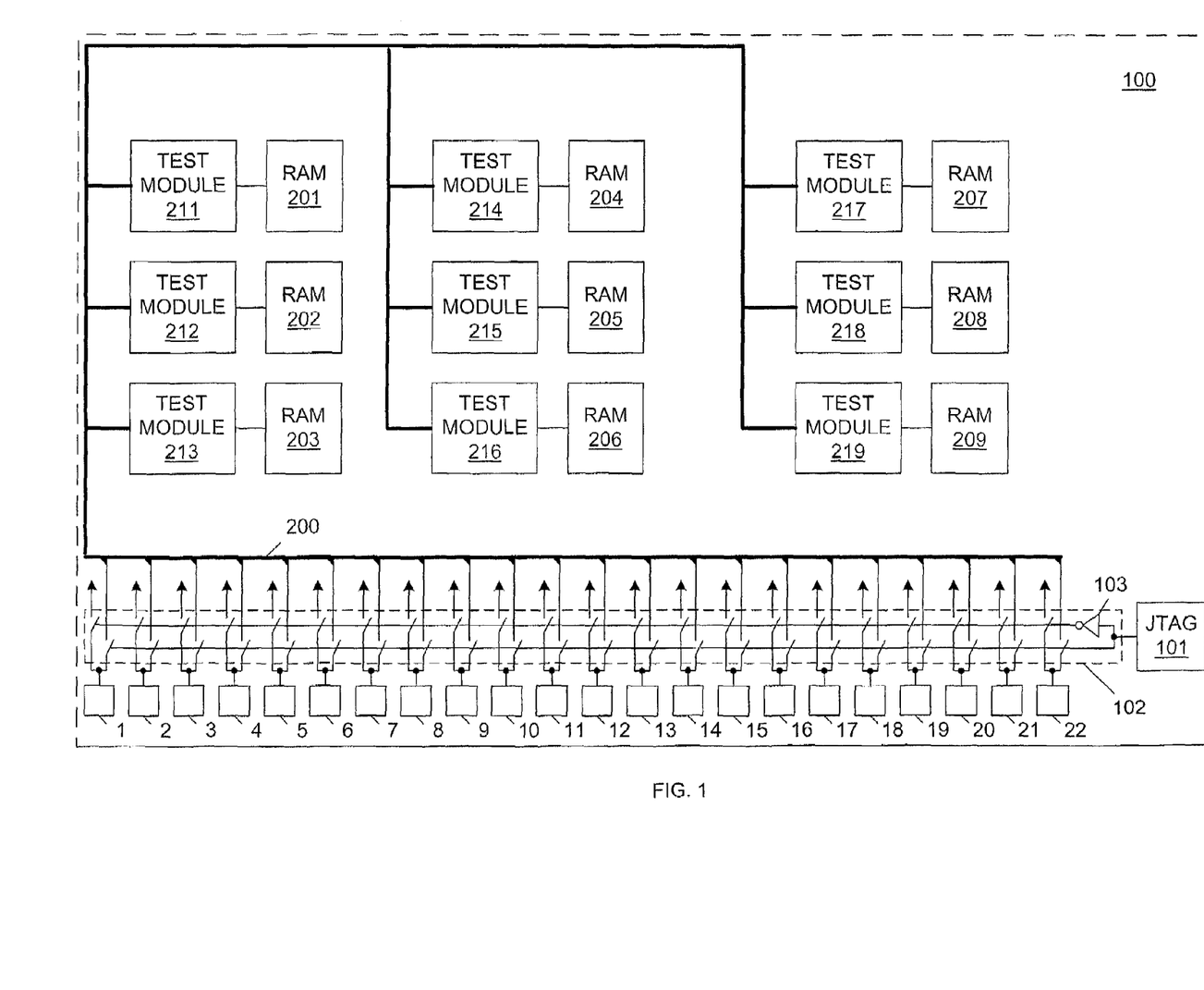
FIG. 1 is a block diagram of a portion of a chip having a test bus in accordance with one embodiment of the present invention.

FIG. 1 is a block diagram of a portion of an integrated circuit chip 100 having a test bus 200 in accordance with one embodiment of the present invention. The illustrated portion of chip 100 includes pads 1–22, JTAG controller 101, switching structure 102, inverter 103, test bus 200, embedded RAM/register blocks 201–209 and test modules 211–219. Although chip 100 includes many other elements, such as additional pads, interconnect structures, logic and memory, these additional elements are not shown for purposes of clarity. Moreover, although only nine RAM/register blocks are shown in the present example, it is understood that chip 200 can include many additional RAM/register blocks in other embodiments. In general, each of embedded RAM/register blocks 201–209 is a relatively small memory, having a capacity of about 4 Kb or less. Memories of this capacity are typically considered too small to efficiently include their own dedicated BIST circuitry. In other embodiments one or more of RAM/register blocks 201–209 are relatively large memories, which may have included their own dedicated BIST circuitry in prior art chips.

Switching structure 102 is controlled by a tap signal provided by JTAG controller 101. During normal operation of chip 100, JTAG controller 101 provides a logic low signal to switching structure 102. Under these conditions, inverter 103 provides a logic high signal to the upper set of switches in switching structure 102, thereby causing these switches to close. Conversely, the lower set of switches in switching structure 102 receive a logic low signal, thereby causing these switches to open. As a result, pads 1–22 are isolated from test bus 200, and are coupled to predetermined circuitry (not shown) on chip 100.

However, during testing of chip 100, JTAG controller 101 is configured to provide a logic high signal to switching structure 102. In the described embodiment, one of the optional tap signals provided by JTAG controller 101 is used to provide the control signal to switching structure 102. Under these conditions, inverter 103 provides a logic low signal to the upper set of switches in switching structure 102, thereby causing these switches to open. Conversely, the lower set of switches in switching structure 102 receive a logic high signal, thereby causing these switches to close. As a result, pads 1–22 are connected to test bus 200, and are isolated from the predetermined circuitry. At this time, pads 1–22 are connected to test modules 211–219. Using switching structure 102 and JTAG controller 101 to provide the connections between pads 1–22 and test bus 200 advantageously reduces the pin count of chip 100, because additional pads are not required to access the test bus 200.

Test bus 200 is a versatile and efficient 22-signal bus that is coupled to each RAM/register block of chip 100 (through a corresponding test module). In the examples described below, test bus 200 supports a dual-port memory having two read/write ports. However, it is understood that test bus 200 is capable of supporting memories with any number of read/write ports.

Figure 2:
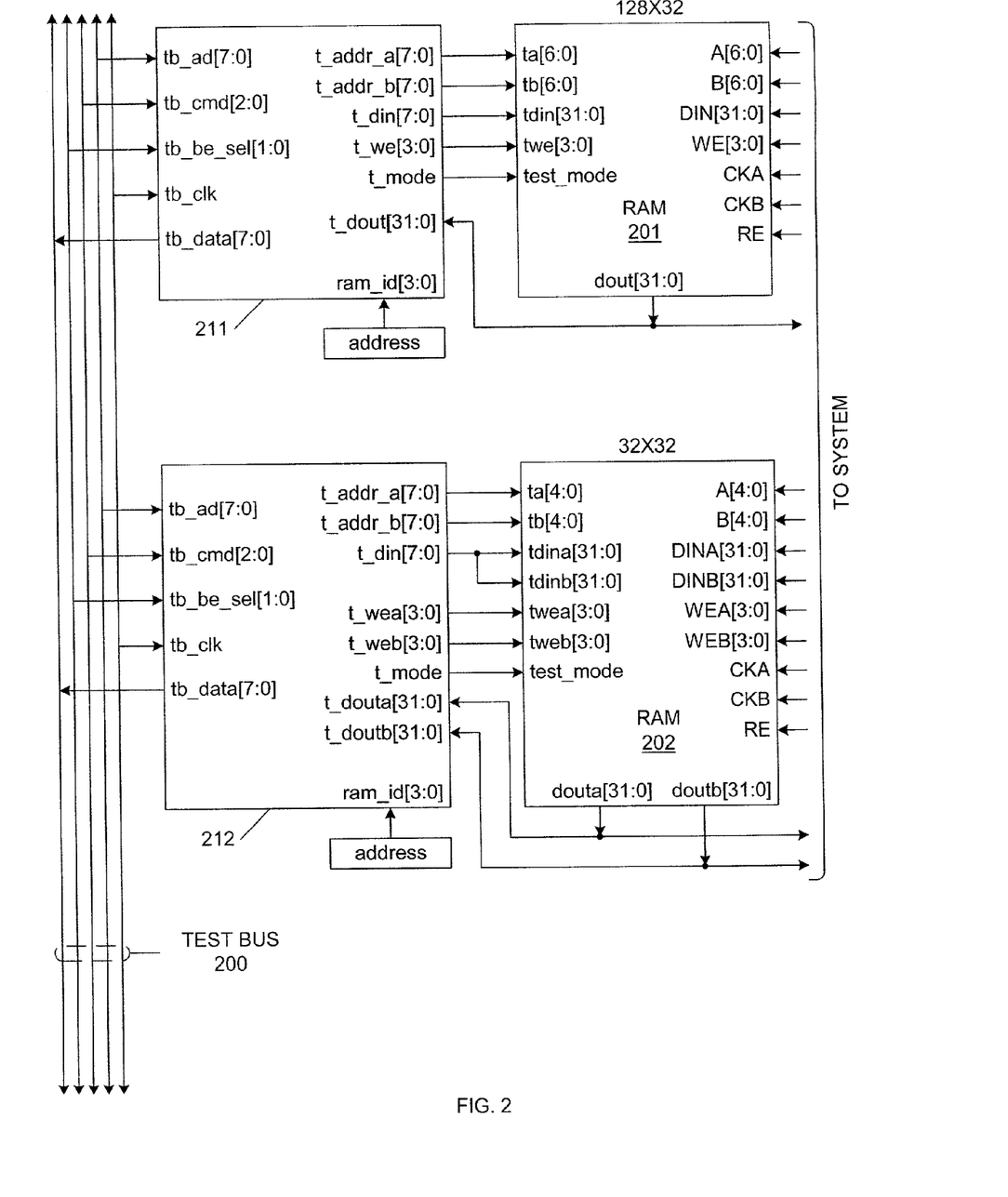
FIG. 2 is a block diagram of selected RAM/register blocks, corresponding test modules, and the test bus of FIG. 1.

FIG. 2 is a block diagram that illustrates RAM/register blocks 201–202, corresponding test modules 211–212, and test bus 200 in more detail. In the described embodiment, RAM/register block 201 is a dual-port RAM that is 128 words deep and 32 bits wide. RAM/register block 201 has one write port and one read port, which are controlled independent of one another. Separate clock input terminals are provided for the read port and the write port, thereby allowing the two ports to run asynchronously from each other. In the described examples, each of the clock input terminals is connected to receive a system clock signal. As a result, RAM/register block 201 operates in response to the system clock signals during the test mode. In the described embodiment, the core of RAM/register block 201 has a latch-based design, which uses conventional static random access memory (SRAM) cells. RAM/register block 201 is byte-write enabled, such that 8-bit bytes can be written to the write port of RAM/register block 201.

RAM/register block 201 receives the following input signals during normal operation of chip 100: write address signal A[6:0], read address signal B[6:0], data input signal DIN[31:0], byte-write enable signal WE[3:0], write clock signal CKA, read clock signal CKB and RAM enable signal RE. The write input signals A[6:0], DIN[31:0] and WE[3:0] are synchronous with the write clock signal CKA. The read input signal B[6:0] is synchronous with the read clock signal CKB. The output signals DOUT[31:0] provided by RAM 201 are asynchronous. RAM/register block 201 is designed to operate in response to clock signals (CKA and CKB) having frequencies of up to 266 MHz.

Figure 3:
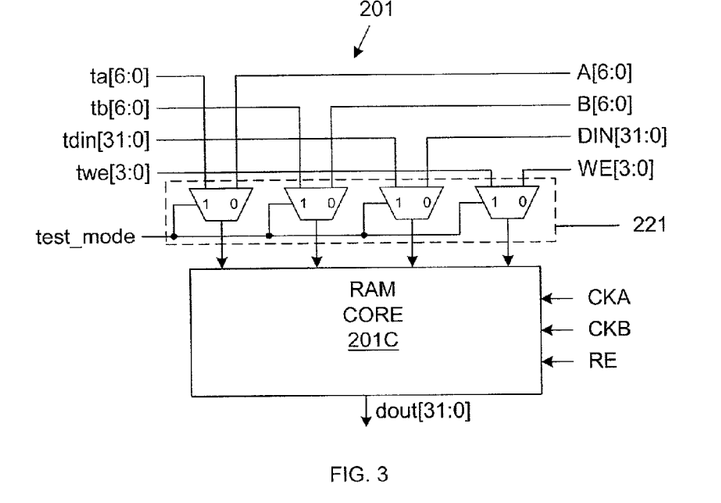
FIG. 3 is a block diagram of a dual-port RAM/register block having one read port and one write port in accordance with one embodiment of the present invention.

FIG. 3 illustrates RAM/register block 201 in more detail. As described in more detail below, test module 211 asserts a t_mode signal during the test mode. The t_mode signal is received by PAM/register block 201 as the signal, test_mode. Within RAM/register block 201, the test_mode signal controls a set of multiplexers 221. When the test_mode signal is de-asserted low, the system input signals A[6:0], B[6:0], DIN[31:0], and WE[3:0] are provided to control the RAM core 201C. Conversely, when the test_mode signal is asserted high, the test signals ta[6:0], tb[6:0], tdin[31:0] and twe[3:0] from test module 211 are provided to control RAM core 201C. The test signals ta[6:0], tb[6:0], tdin[31:0] and twe[3:0] are described in more detail below.

Returning now to FIG. 2, RAM/register block 202 is a dual-port RAM that is 32 words deep and 32 bits wide.

RAM/register block 202 has two independent read/write ports. Separate clock input terminals are provided for the first read/write port and the second read/write port, thereby allowing the two ports to run asynchronously from each other. In the described examples, each of the clock input terminals is connected to receive a system clock signal. As a result, RAM/register block 202 operates in response to the system clock signals during the test mode. In the described embodiment, the core of RAM/register block 202 has a latch-based design, which uses conventional SRAM cells. RAM/register block 202 is byte-write enabled, such that 8-bit bytes can be written to the write ports of RAM/register block 202.

RAM/register block 201 receives the following input signals during normal operation of chip 100: first port read/write address signal A[6:0], second port read/write address signal B[6:0], first port data input signal DINA[31:0], second port data input signal DINB[31:0], first port byte-write enable signal WEA[3:0], second port byte-write enable signal WEB[3:0], first port clock signal CKA, second port clock signal CKB and RAM enable signal RE. The first port input signals A[6:0], DINA[31:0] and WEA[3:0] are synchronous with the first port clock signal CKA. The second port input signals B[6:0], DINB[31:0] and WEB[3:0] are synchronous with the second port clock signal CKB. The first port output signals DOUTA[31:0] and the second port output signals DOUTB[31:0] provided by RAM/register block 202 are asynchronous. RAM/register block 202 is designed to operate in response to clock signals (CKA and CKB) having frequencies of up to 100 MHz.

Figure 4:
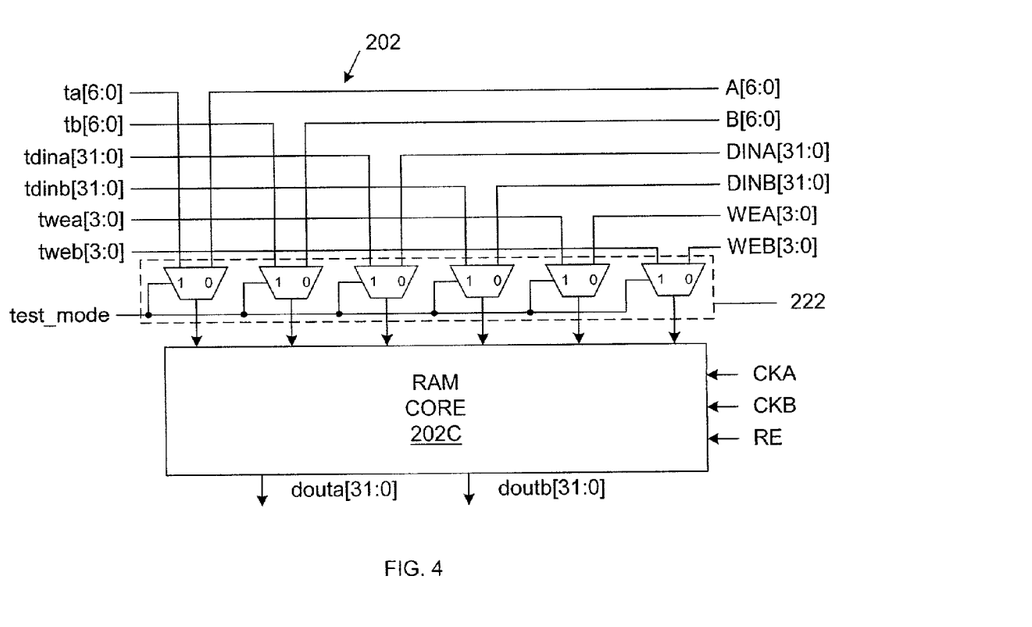
FIG. 4 is a block diagram of a dual-port RAM/register block having two read ports and two write ports in accordance with one embodiment of the present invention.

FIG. 4 illustrates RAM/register block 202 in more detail. As described in more detail below, test module 212 asserts a t_mode signal during the test mode. The t_mode signal is received by RAM/register block 202 as the signal, test_mode. Within RAM/register block 202, the test_mode signal controls a set of multiplexers 222. When the test_mode signal is de-asserted low, the system input signals A[6:0], B[6:0], DINA[31:0], DINB[31:0], WEA[3:0] and WEB[3:0] are provided to control the RAM core 202C. Conversely, when the test_mode signal is asserted high, the test signals ta[6:0], tb[6:0], tdina[31:0], tdinb[31:0], twea[3:0] and tweb [3:0] from test module 212 are provided to control RAM core 202C. The test signals ta[6:0], tb[6:0], tdina[31:0], tdinb[31:0], twea[3:0] and tweb[3:0] are described in more detail below.

Although RAM/register blocks 201–202 have the characteristics described above in the present embodiment, it is understood that RAM/register blocks 201–202 can have other characteristics in other embodiments of the present invention.

RAM/register blocks 201 and 202 are coupled to test bus 220 by test modules 211 and 212, respectively. Test bus 220 is a 22-bit bus that carries an 8-bit test bus address/data input signal tb_ad[7:0], a 3-bit test bus command signal tb_cmd

[2:0], a 2-bit test bus byte-enable select signal tb_be_sel[1:0], a test bus clock signal tb_clk, and an 8-bit test bus data output signal tb_data[7:0].

Because the test bus address/data input signal tb_ad[7:0] is 8-bits wide, test bus 200 is capable of addressing up to 256 words in the present embodiment. Larger RAMS can be addressed in other embodiments by increasing the number of address bits. Because the test bus data output signal tb_data[7:0] is only 8-bits wide, only 8 bits of data can be read from one of the RAM/register blocks 201–209 at a time. The input signals provided to test modules 211–219 (i.e., the tb_ad[7:0], tb_cmd[2:0], and tb_be_sel[1:0] signals) are all referenced to the tb_clk signal, independent of the system clock signals (CKA and CKB). Each of test modules 211–219 is assigned a unique address ram_id[3:0], which is used to access the corresponding RAM/register block during a read operation. In the described embodiment, the ram_id[3:0] address is hardwired into a corresponding register in the test module. The test bus signals are summarized below in Table 1.

TABLE 1

Test Bus Signals

| Signal | Type | Description |
| --- | --- | --- |
| tb_ad [7:0] | Sync. Input | Provide address or write data to all RAMS, latched by tb_clk |
| tb_data [7:0] | Async. Output | Read data output from selected RAM |
| tb_cmd [2:0] | Sync. Input | 3-bit instruction bus, latched by tb_clk |
| tb_be_sel [1:0] | Async. Input | 2-bit byte select bus |
| tb_clk | Clock | Test clock, latches in new commands when high, maintains all states when low. |
| ram_id [3:0] | Internal input | Unique 4-bit assigned address for each RAM. |

A single command and control bus tb_cmd[2:0] is provided for testing all RAMs. There are 8 instructions passed via the 3-bit command bus tb_cmd[2:0]. These instructions are summarized below in Table 2.

TABLE 2

Command Bus Instruction Decode

| TB_CMD [2:0] | FUNCTION | DESCRIPTION |
| --- | --- | --- |
| 000 | NOP | Normal chip operation mode (test mode is in idle) |
| 001 | ld_sel_add | Select a RAM (or RAM port) address (only used for reads) |
| 010 | ld_addr_a | Latch the address port (port A of all RAMs) |
| 011 | ld_addr_b | Latch the address for port-B (used for dual-port RAMs) |
| 100 | wr_a | Perform a write operation to all RAMs (through port A) |
| 101 | wr_b | Perform a write operation to port B of dual port RAMs |
| 110 | rd_a | Perform a read operation from port A of dual port RAM |
| 111 | rd_b | Perform a read operation from port B of a RAM |

During the test operation, test signals are transmitted between test module 211 and RAM 201. The signals between test module 211 and RAM 201 are defined below in Table 3.

TABLE 3

TEST SIGNALS BETWEEN 201 AND 211

| Signal | Type | Description |
| --- | --- | --- |
| t_addr_a [7:0] | Output | Test mode address A |
| t_addr_b [7:0] | Output | Test mode address B |
| t_din [7:0] | Output | Test mode write data in to RAM |
| t_we [3:0] | Output | Test mode byte enable for write and read |
| t_mode | Output | Test mode control signal |
| t_dout [31:0] | Input | Test mode read data out from selected RAM |

During the test operation, test signals are transmitted between test module 212 and RAM 202. The signals between test module 212 and RAM 202 are defined below in Table 4.

TABLE 4

TEST SIGNALS BETWEEN 202 AND 212

| Signal | Type | Description |
| --- | --- | --- |
| t_addr_a [7:0] | Output | Test mode address A |
| t_addr_b [7:0] | Output | Test mode address B |
| t_din [7:0] | Output | Test mode write data in to RAM |
| t_wea [3:0] | Output | Test mode byte enable for write and read port A |
| t_web [3:0] | Output | Test mode byte enable for write and read port B |
| t_mode | Output | Test mode control signal |
| t_douta [31:0] | Input | Test mode read data out from selected RAM, port A |
| t_doutb [31:0] | Input | Test mode read data out from selected RAM, port B |

In the described example, the ram_id[3:0] address of test module 211 (and RAM/register block 201) is selected to be 0000, and the ram_id[3:0] address of test module 212 (and RAM/register block 202) is selected to be 0001. These addresses are hardwired within the test modules using non-volatile memory, such as fuses, or simply bits tied to logic high or logic low through supply connections. Although not described in detail herein, each of test modules 213–219 is also assigned a unique address.

Figure 5:
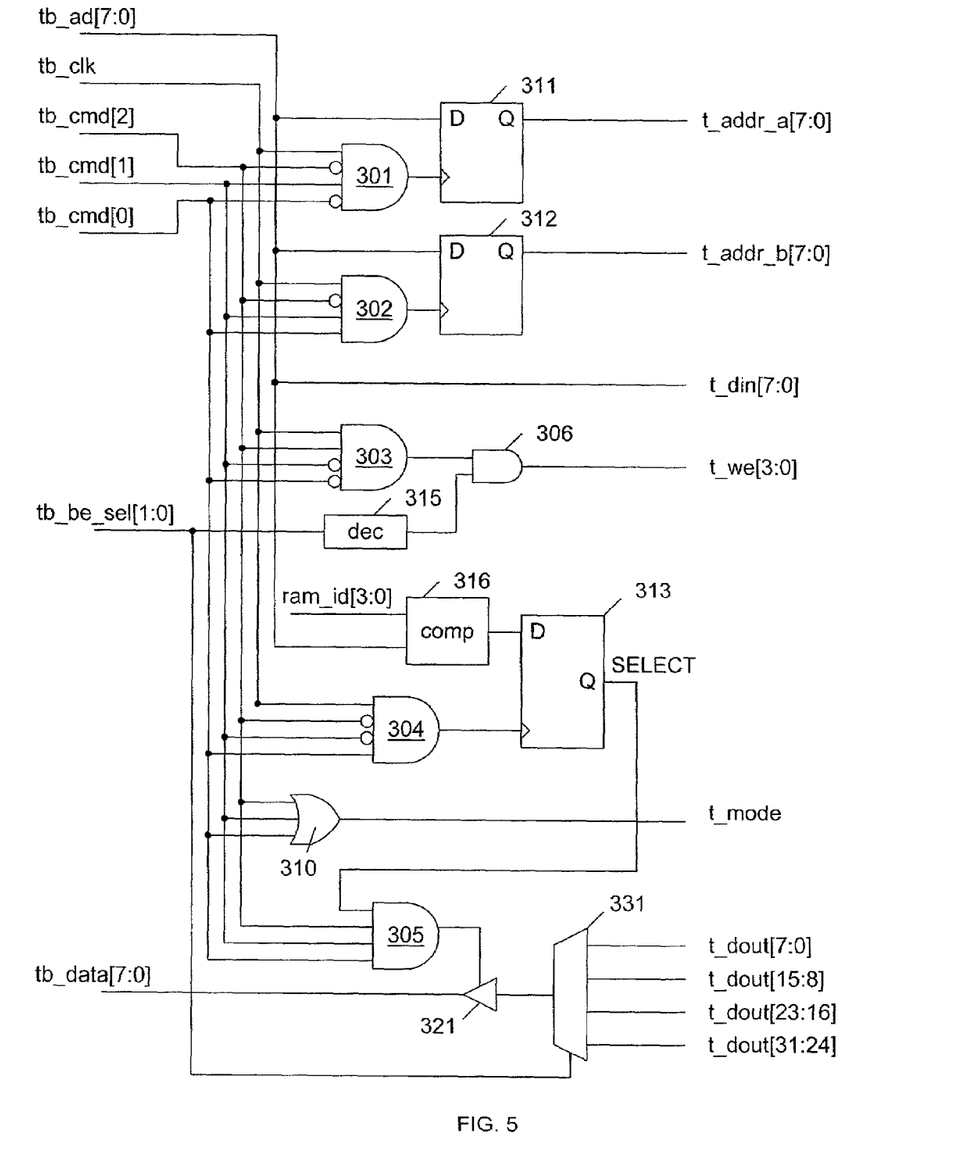
FIG. 5 is a circuit diagram of a test module for the RAM/register block of FIG. 3 in accordance with one embodiment of the invention.

FIG. 5 is a circuit diagram of test module 211 in accordance with one embodiment of the invention. Test module 211 includes logical AND gates 301–306, logical OR gate 310, D-type flip-flops 311–313, decoder 315, comparator 316, tri-state buffer 321 and 4-to-1 multiplexer 331.

Figure 6:
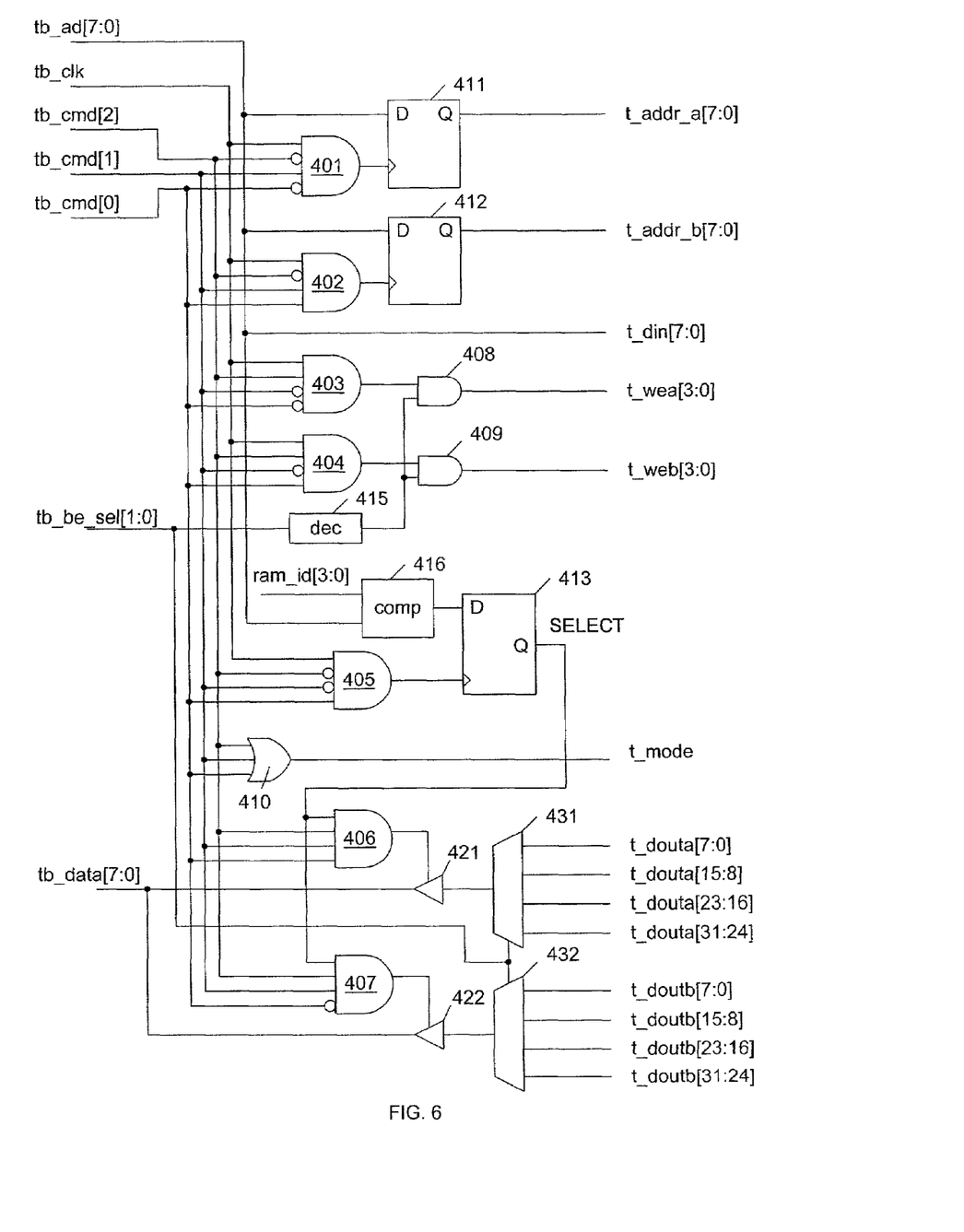
FIG. 6 is a circuit diagram of a test module for the RAM/register block of FIG. 4 in accordance with one embodiment of the invention.

FIG. 6 is a circuit diagram of test module 212 in accordance with one embodiment of the invention. Test module 212 includes logical AND gates 401–409, logical OR gate 410, D-type flip-flops 411–413, decoder 415, comparator 416, tri-state buffers 421–422 and 4-to-1 multiplexers 431–432.

RAM/register blocks 201 and 202 are tested as follows. Although not described in detail below, it is understood that RAM/register blocks 203–209 are tested at the same time and in the same manner as RAM/register blocks 201 and 202. To initiate the test mode, the test bus command signal tb_cmd[2:0] is set to a value of "010", while the test bus clock tb_clk has a logic low value. The input terminals of OR gates 310 and 410 are coupled to receive the test bus command signals tb_cmd[2:0]. These OR gates 310 and 410 provide logic high t_mode signals in response to the "010" value of the tb_cmd[2:0] signals. As illustrated in Table 2, at least one of the tb_cmd[2:0] signals has a logic high value for each instruction provided during the test mode. Thus, during the test mode, OR gates 310 and 410 provide logic high t_mode signals to PAM/register blocks 201 and 202, respectively. In response to the logic high t_mode (test_mode) signals, RAM/register blocks 201 and 202 are configured to operate in response to the signals provided by test modules 211 and 212, respectively. (See, FIGS. 3 and 4.)

The test bus address/data signal tb_ad[7:0] is also set to the first desired write address (WA1) while the tb_clk signal has a logic low value. The tb_ad[7:0] signal is applied to the D input terminals of flip-flops 311 and 411. The three bits of the "010" tb_cmd[2:0] signal are applied to inverting, non-inverting and inverting input terminals, respectively, of AND gates 301 and 401.

The tb_clk signal, which is applied to non-inverting input terminals of AND gates 301 and 401, then transitions to a logic high state, thereby causing AND gates 301 and 401 to provide logic high signals to the clock input terminals of flip-flops 311 and 411, respectively. At this time, the first write address WA1 is latched into registers 311 and 411 as the t_addr_a[7:0] signal. The first write address WA1 is thereby provided to RAM/register blocks 201 and 202 at this time. The test bus clock signal tb_clk then transitions to a logic low state.

The tb_ad[7:0] signal is then set equal to a first test data value TD1. This first test data value TD1 can be any desired pattern of 0's and 1's to be written to RAM/register blocks 201–209. The tb_ad[7:0] signal is routed directly to RAM/register blocks 201–202 as the t_din[7:0] signal.

The test bus byte enable select signal tb_be_sel[1:0] is selected to correspond with one of four byte locations in the first write address WA1. In the described example, the tb_be_sel[1:0] signal is initially selected to have a "00" value. The tb_be_sel[1:0] signal is routed to decoders 315 and 415. In response, decoders 315 and 415 each provide a corresponding 4-bit byte-enable signal. In the described embodiment, tb_be_sel[1:0] signals having values of "00", "01", "10", and "11" will cause decoders 315 and 415 to generate byte-enable signals with values of "0001", "0010", "0100", and "1000", respectively. The 4-bit byte enable signals are routed from decoders 315 and 415 to AND gates 306 and 408-409, respectively.

After the tb_clk signal transitions to a low value, the tb_cmd[2:0] signal is set to a value of "100". The three bits of the tb_cmd[2:0] signal are applied to non-inverting, inverting and inverting input terminals, respectively, of AND gates 303 and 403. The tb_clk signal is applied to non-inverting input terminals of AND gates 303 and 403. When the tb_clk signal transitions to a logic high state, the "100" value of the tb_cmd[2:0] signal and the logic high value of the tb_clk signal causes AND gates 303 and 403 to provide logic high values to AND gates 306 and 408, respectively. As a result, AND gates 306 and 408 pass the decoded byte-enable signals from decoders 315 and 415, respectively, to RAM/register blocks 201 and 202, respectively, as the write enable signals t_we[3:0] and t_wea[3:0], respectively.

Subsequently, the CKA system clock signal transitions to a logic high state, thereby causing the first test data value TD1 to be written to the first byte location of the first write address WA1 in RAM/register block 201. The first test data value TD1 is also written to the first byte location of the first write address WA1 of the first write port of RAM/register block 202 at this time. Note that the first test data value TD1 is similarly written to RAM/register blocks 203–209, even though these blocks are not specifically described in the present example.

A second test data value is then written to a second byte location of the first write address WA1 by providing the desired test data value as the tb_ad[7:0] signal, incrementing the tb_be_sel[1:0] signal to a value of "01", and keeping the tb_cmd[2:0] signal at a value of "100". At the next rising edge of the tb_clk signal, the decoded tb_be_sel[1:0] signal is provided to RAM/register blocks 201 and 202, respectively, as the write enable signals t_we[3:0] and t_wea[3:0], respectively.

Subsequently, the CKA system clock signal transitions to a logic high state, thereby causing the second test data value TD2 to be written to the second byte location of the first write address WA1 in RAM/register block 201, and to the second byte location of the first write address WA1 of the first write port of RAM/register block 202.

These steps are repeated to write test data values to the third and fourth byte locations of the first write address WA1 in RAM/register blocks 201–209.

The above-described process is repeated until RAM/register block 201 has been filled with test data values. Note that there are 128 write addresses associated with RAM/register block 201, and only 32 write addresses associated with the first write port of RAM/register block 202. As a result, RAM/register block 202 will be written four times.

Alternately, test data values can be written to RAM/register block 202 through the second write port of RAM/register block 202. To accomplish this, the test bus command signal tb_cmd[2:0] is set to a value of "011", while the test bus clock tb_clk has a logic low value. The test bus address/data signal tb_ad[7:0] is also set to the desired write address (WB1) while the tb_clk signal has a logic low value. The tb_ad[7:0] signal is applied to the D input terminal of flip-flop 412. The three bits of the "011" tb_cmd[2:0] signal are applied to inverting, non-inverting and non-inverting input terminals, respectively, of AND gate 402.

The tb_clk signal, which is applied to a non-inverting input terminal of AND gate 402, then transitions to a logic high state, thereby causing AND 402 to provide a logic high signal to the clock input terminal of flip-flop 412. At this time, the first write address WB1 is latched into register 412 as the t_addr_b[7:0] signal. The first write address WB1 is thereby provided to RAM/register block 202 at this time. The tb_clk signal then transitions to a logic low state.

The tb_ad[7:0] signal is then set equal to a first test data value TD1, and is routed directly to RAM/register block 202 as the t_din[7:0] signal.

The test bus byte enable select signal tb_be_sel[1:0] is selected to correspond to one of four byte locations in the first write address WB1. The tb_be_sel[1:0] signal is routed to decoder 415. In response, decoder 415 provides a corresponding 4-bit byte-enable signal. The 4-bit byte enable signals are routed from decoder 415 to AND gate 408 and 409.

After the tb_clk signal transitions to a low value, the tb_cmd[2:0] signal is set to a value of "101". The three bits of the tb_cmd[2:0] signal are applied to non-inverting, inverting and non-inverting input terminals, respectively, of AND gate 404. The tb_clk signal is applied to a non-inverting input terminal of AND gate 404. When the tb_clk signal transitions to a logic high state, the "101" value of the tb_cmd[2:0] signal and the logic high value of the tb_clk signal cause AND gate 404 to provide a logic high value to AND gate 409. As a result, AND gate 409 passes the decoded byte-enable signals from decoder 415 to RAM/register block 202, as the write enable signal t_web[3:0].

Subsequently, the CKB system clock signal transitions to a logic high state, thereby causing the first test data value TD1 to be written to the first byte location of the first write address WB1 of the second write port of RAM/register block 202. Note that data is not written to the first write port of RAM/register block 202 at this time because AND gate 408 provides a t_wea[3:0] signal having a value of "0000" in response to the "101" tb_cmd[2:0] signal. Also note that data is not written to RAM/register 201 at this time because AND gate 306 provides a t_we[3:0] signal having a value of "0000" in response to the "101" tb_cmd[2:0] signal. Additional data values can be written to the second write port of RAM/register block 202 in the manner described above.

After RAM/register blocks 201 and 202 have been written with the desired test data values, the contents of RAM/register blocks 201 and 202 are read out to determine whether these blocks are reliably storing the written test data values. Although the test data values are broadcast to all of the RAM/register blocks during the write operations, each of the RAM/register blocks must be individually accessed during the read operation.

The test data values are read from RAM/register block 201 as follows. The tb_ad[7:0] signal is selected such that the tb_ad[3:0] bits have a value of "0000". The tb_ad[3:0] bits are provided to comparator 316. Comparator 316 determines that the tb_ad[3:0] bits match the unique address ram_id[3:0] associated with RAM/register block 201. In response, comparator 316 asserts a logic high output signal, which is applied to the D input terminal of flip-flop 313.

The tb_cmd[2:0] signal is then set to a value of "001" while the tb_clk signal has a logic low value. The three bits of the tb_cmd[2:0] signal are applied to inverting, inverting and non-inverting input terminals, respectively, of AND gate 304. As a result, the next rising edge of the tb_clk signal (along with the "001" tb_cmd[2:0] signal) causes AND gate 304 to provide a logic high value to the clock terminal of flip-flop 313. Under these conditions, the logic high value provided by comparator 316 is latched into flip-flop 313, thereby providing a logic high SELECT signal. The logic high SELECT signal is provided to an input terminal of AND gate 305. The tb_clk signal then returns to a low state.

The tb_ad[7:0] signal is then set to the first desired read address, RB1. The tb_cmd[2:0] signal is then set to a value of "011". The three bits of the tb_cmd[2:0] signal are applied to inverting, non-inverting and non-inverting input terminals, respectively, of AND gate 302. As a result, the next rising edge of the tb_clk signal (along with the "011" tb_cmd[2:0] signal) causes AND gate 302 to provide a logic high value to the clock terminal of flip-flop 312. Under these conditions, the read address RB1 is latched into flip-flop 312, and routed to RAM/register block 201 as the t_addr_b [7:0] signal.

At the next rising edge of the CKB signal, RAM/register block 201 provides a test data value corresponding with the first read address RB1 to multiplexer 331 as the read output signals t_dout[31:24], t_dout[23:16], t_dout[15:8], and t_dout[7:0].

The tb_be_sel[1:0] signal is selected to correspond with one of four byte locations in the first read address. The tb_be_sel[1:0] signal is routed to multiplexer 331. In response, multiplexer 331 provides a corresponding one of the read output signals t_dout[31:24], t_dout[23:16], t_dout [15:8], and t_dout[7:0]. In the described embodiment, tb_be_sel[1:0] signals having values of "11", "10", "01", and "00" will cause multiplexer 331 to pass the read output signals t_dout[31:24], t_dout[23:16], t_dout[15:8], and t_dout[7:0], respectively. The read output signals routed by multiplexer 331 are provided to tri-state buffer 321.

At this time, the tb_cmd[2:0] signal is driven to a value of "111". The three bits of the tb_cmd[2:0] signal are applied to non-inverting input terminals of AND gate 305. In response to the "111" tb_cmd[2:0] signal and the logic high SELECT signal, AND gate 305 provides a logic high value to the enable terminal of tri-state buffer 321, thereby enabling tri-state buffer 321. In response, tri-state buffer 321 provides the read output signals routed by multiplexer 331 as the output data signals tb_data[7:0]. These output data signals tb_data[7:0] are compared with the test data values previously written to RAM/register block 201, thereby determining whether RAM/register block 201 is reliably storing the written test data values.

In the described embodiment, the tb_be_sel[1:0] signal is cycled through the values of "00", "01", "10" and "11", such that the read data values t_dout[7:0], t_dout[15:8], t_dout [23:16], and t_dout[31:24] are all read out as the tb_data[7:0] signal.

The above-described process is repeated for the other read addresses of RAM/register block 201, until all of the test data values in RAM/register block 201 have been read.

After the test data values have been read from RAM/register block 201, the test data values can be read from another RAM/register block, such as RAM/register block 202. A similar process is used to read the test data values from RAM/register block 202. However, the process is slightly different because of the dual-port nature of RAM/register block 202. Thus, the tb_ad[3:0] bits are initially set to a value of "0001", thereby matching the ram_id[3:0] of RAM/register block 202, and causing comparator 416 to provide a logic high value to the D input terminal of flip-flop 413. The tb_cmd[2:0] signal is then set to "001", thereby causing flip-flop 413 to latch the logic high value provided by comparator 416 at the next rising edge of the tb_clk signal. As a result, flip-flop 413 provides a logic high SELECT signal to AND gates 406 and 407.

To read test data values from the first port of RAM/register block 202, the tb_ad[7:0] signal is set to the desired read address, and the tb_cmd[2:0] signal is set to "010", such that the read address is latched in flip-flop 411 at the next rising edge of the tb_clk signal. In response, RAM/register block 202 provides the output data values t_douta[7:0], t_douta[15:8], t_douta[23:16] and t_douta[31:24] from the first read port of RAM/register block 202 to multiplexer 431. The tb_be_sel[1:0] signal is selected to cause multiplexer 431 to route a desired one of these output data values to tri-state buffer 421. The tb_cmd[2:0] signal is then set to a value of "111", thereby causing AND gate 406 to provide a logic high value to enable tri-state buffer 421 at the next rising edge of the tb_clk signal. In response, tri-state buffer 421 provides the output data value routed by multiplexer 431 as the output data signal tb_data[7:0].

To read test data values from the second port of RAM/register block 202, the tb_ad[7:0] signal is set to the desired read address, and the tb_cmd[2:0] signal is set to "011", thereby causing the read address to be latched in flip-flop 412 at the next rising edge of the tb_clk signal. In response, RAM/register block 202 provides the output data values t_doutb[7:0], t_doutb[15:8], t_doutb[23:16] and t_doutb[31:24]from the second read port of RAM/register block 202 to multiplexer 432. The tb_be_sel[1:0] signal is selected to cause multiplexer 432 to route a desired one of these output data values to tri-state buffer 422. The tb_cmd[2:0] signal is then set to a value of "110", thereby causing AND gate 408 to provide a logic high value to enable tri-state buffer 422 at the next rising edge of the tb_clk signal. In response, tri-state buffer 422 provides the output data value routed by multiplexer 432 as the output data signal tb_data[7:0].

In the foregoing manner, test data values can be written and read from the RAM/register blocks of an integrated circuit chip in an efficient manner.

Note that the signals on test bus 200 can be operated in response to a test clock signal (tb_clk), while the RAM/register blocks 201–209 are operated in response to the system clock signals (i.e., the CKA and CKB signals). These clock signals are independent, thereby allowing these clock signals to be different. Because the edges of the first clock signal can be adjusted relative to the edges of the system clock during test mode, the RAM/register blocks 201–209 to be subjected to stress testing, wherein the maximum operating speed of RAM/register blocks 201–209 is determined. For example, the read address can be applied 2 nanosec prior to the CKA signal to test the read setup time, or the t_we signal can be applied 2 nanosec prior to the CKA signal to test the minimum write time.

Although the present invention has been described in connection with several embodiments, it is understood that this invention is not limited to the embodiments disclosed, but is capable of various modifications which would be apparent to one of ordinary skill in the art. For example, the output data bus tb_data[7:0] could be combined with the address/data bus tb_ad[7:0] in another embodiment of the present invention, thereby resulting in a 14-bit test bus. However, the combined address/data bus would have to be a tri-state bus to facilitate both the input and output of test data values on the same lines. Thus, the invention is limited only by the following claims.

The invention claimed is:

1. An integrated circuit chip comprising:
   a plurality of random access memory (RAM) blocks, wherein each of the RAM blocks is accessible by system circuitry located on the chip during normal operation of the chip;
   a plurality of test modules, each being coupled to a corresponding one of the RAM blocks, wherein each of the test modules enables access to a corresponding one of the RAM blocks, independent of the system circuitry; and
   a dedicated test bus coupled to each of the test modules, wherein each of the test modules includes circuitry configured to route addresses received on the dedicated test bus to a corresponding one of the RAM blocks, whereby the corresponding one of the RAM blocks is accessed in response to the routed addresses.

2. The integrated circuit chip of claim 1, further comprising:
   a plurality of pads; and
   a switching structure coupled to the plurality of pads, wherein the switching structure is configured to alternately couple the plurality of pads to the dedicated test bus and the system circuitry.

3. The integrated circuit chip of claim 2, further comprising a JTAG controller configured to control the switching structure.

4. The integrated circuit chip of claim 2, wherein the plurality of RAM blocks comprise dual-port and two-port RAM blocks.

5. The integrated circuit chip of claim 1, wherein the dedicated test bus comprises:
   a first set of lines for transmitting address and data signals to the test modules;
   a second set of lines for transmitting command signals to the test modules; and
   a third set of one or more lines for transmitting a signal for latching the command signals.

6. The integrated circuit chip of claim 5, wherein the dedicated test bus further comprises a fourth set of lines for transmitting byte-enable signals to the test modules.

7. The integrated circuit chip of claim 5, wherein the dedicated test bus further comprises a fourth set of lines for transmitting data values from the test modules.

8. The integrated circuit chip of claim 1, wherein each of the test modules comprises a register for storing a unique address.

9. The integrated circuit chip of claim 1, wherein each of the RAM blocks includes a multiplexer structure for alternately routing input signals from a corresponding test module or the system circuitry, the multiplexer structure being controlled by a signal from the corresponding test module.

10. The integrated circuit chip of claim 1, wherein each of the RAN blocks has a capacity of 32 Kb or less.

11. The integrated circuit chip of claim 1, wherein the dedicated test bus comprises a clock line for routing a clock signal to each of the test modules.

12. The integrated circuit chip of claim 1, wherein each of the test modules further comprises a comparator coupled to receive a unique identification address and the addresses received on the dedicated test bus, wherein the comparator enables a read operation from the corresponding one of the RAM blocks if the unique identification address matches an address received on the dedicated test bus.

13. A method of operating RAN blocks having a capacity less of 32 Kb or less embedded in system circuitry on an integrated circuit chip, the method comprising the steps of:
   accessing the RAN blocks through the system circuitry during normal operation of the chip; and
   accessing the RAN blocks through a dedicated test bus during a test mode to test the functionality of the RAN blocks prior to normal operation of the chip, wherein the RAN blocks are accessed in response to addresses broadcast on the dedicated test bus.

14. The method of claim 13, further comprising the steps of accessing the RAN blocks through dedicated test modules coupled to the test bus during the test mode.

15. The method of claim 14, further comprising the step of storing a unique address in each of the test modules.

16. The method of claim 13, wherein the chip comprises a plurality of pads, the method further comprising the steps of:
   coupling the pads to the system circuitry during normal operation of the chip; and
   coupling the pads to the test bus during the test mode.

17. The method of claim 16, further comprising the step of controlling the coupling of the pads using a JTAG controller.

18. The method of claim 13, further comprising the steps of:
   writing test data values to the RAM blocks by broadcasting the test data values to all of the RAM blocks on the test bus; and then
   reading test data values from the RAM blocks by individually accessing the RAM blocks on the test bus.

19. The method of claim 18, further comprising the steps of:
   writing test data values to RAM blocks having one write port and to the first write port of RAM blocks having more than one write port; and then
   writing test data values to the second write port of RAM blocks having more than one write port.

20. The method of claim 14, further comprising the steps of:
operating the test modules in response to a first clock signal provided on the test bus during the test mode; and
operating the RAM blocks in response to a second clock signal provided on the system circuitry during the test mode, wherein the first clock signal and the second clock signal are independent signals.

21. The method of claim 20, further comprising adjusting edges of the first clock signal relative to edges of the second clock signal.

* * * * *